United States Patent
Lai et al.

(10) Patent No.: US 10,944,258 B2
(45) Date of Patent: Mar. 9, 2021

(54) RC CIRCUIT TRIGGERED ELECTROSTATIC DISCHARGE CIRCUIT

(71) Applicant: eMemory Technology Inc., Hsin-Chu (TW)

(72) Inventors: Chih-Wei Lai, Hsinchu County (TW); Yun-Jen Ting, Hsinchu County (TW); Yi-Han Wu, Hsinchu County (TW); Kun-Hsin Lin, Hsinchu County (TW); Hsin-Kun Hsu, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 119 days.

(21) Appl. No.: 16/281,272

(22) Filed: Feb. 21, 2019

(65) Prior Publication Data
US 2019/0326749 A1 Oct. 24, 2019

Related U.S. Application Data

(60) Provisional application No. 62/659,150, filed on Apr. 18, 2018.

(51) Int. Cl.
*H02H 9/04* (2006.01)
*G11C 7/24* (2006.01)
(Continued)

(52) U.S. Cl.
CPC ............... *H02H 9/046* (2013.01); *G11C 7/24* (2013.01); *H01L 27/0255* (2013.01);
(Continued)

(58) Field of Classification Search
CPC . H02H 9/046; H01L 27/0255; H01L 27/0266; H01L 27/0288; H01L 27/0629; H01L 28/20; H01L 28/40
See application file for complete search history.

(56) References Cited

U.S. PATENT DOCUMENTS 6,249,410 B1 * 6/2001 Ker ..................... H01L 27/0251
  361/111
6,310,379 B1 * 10/2001 Andresen ............ H01L 27/0277
  257/355
(Continued)

FOREIGN PATENT DOCUMENTS

| CN | 203396864 U | 1/2014 |
| TW | 200818651 | 4/2008 |
| TW | 201742345 | 12/2017 |

OTHER PUBLICATIONS

Ming-Dou Ker et al. "Capacitor-Couple ESD Protection Circuit for Deep-Submicron Low-Voltage CMOS ASIC", IEEE Transactions on very large scale integration (VLSI) systems, vol. 4, No. 3, Sep. 1996.

(Continued)

*Primary Examiner* — Jeffrey A Gblende
*Assistant Examiner* — Lakaisha Jackson
(74) *Attorney, Agent, or Firm* — WPAT, PC

(57) ABSTRACT

An ESD circuit is connected to a power pad and a first node. The ESD circuit includes a RC circuit and a first ESD current path. The RC circuit is connected between the power pad and the first node. The RC circuit is capable of providing a first control voltage and a second control voltage. The first ESD current path is connected between the power pad and the first node. When the power pad receives a positive ESD zap, the first ESD current path is turned on in response to the first control voltage and the second control voltages provided by the RC circuit, so that an ESD current flows from the power pad to the first node through the first ESD current path.

10 Claims, 5 Drawing Sheets

(51) Int. Cl.
  *H01L 27/02*   (2006.01)
  *H01L 27/06*   (2006.01)
  *H01L 27/092*  (2006.01)
  *H01L 49/02*   (2006.01)

(52) U.S. Cl.
  CPC ...... *H01L 27/0266* (2013.01); *H01L 27/0288* (2013.01); *H01L 27/0629* (2013.01); *H01L 27/0924* (2013.01); *H01L 28/20* (2013.01); *H01L 28/40* (2013.01)

(56) References Cited

U.S. PATENT DOCUMENTS

| | | | |
|---|---|---|---|
| 6,501,632 | B1 | 12/2002 | Avery et al. |
| 2003/0076639 | A1 | 4/2003 | Chen |
| 2008/0259511 | A1* | 10/2008 | Worley ............... H01L 27/0266 361/56 |
| 2010/0157493 | A1 | 6/2010 | Guedon et al. |
| 2018/0102642 | A1 | 4/2018 | Ting et al. |

OTHER PUBLICATIONS

Search report issued by EPO dated Sep. 26 2019.
Office action issued by TIPO dated Oct. 15 2019.
Office Action issued by China National Intellectual Property Administration, dated Dec. 24, 2020.

* cited by examiner

RC CIRCUIT TRIGGERED ELECTROSTATIC DISCHARGE CIRCUIT

This application claims the benefit of U.S. provisional application Ser. No. 62/659,150, filed Apr. 18, 2018, the subject matter of which is incorporated herein by reference.

FIELD OF THE INVENTION

The present invention relates to a circuit, and more particularly to an electrostatic discharge (ESD) circuit.

BACKGROUND OF THE INVENTION

For increasing the operating speed and integration level of integrated circuits, the sizes of the semiconductor devices are gradually decreased. For example, as the size of a CMOS IC is gradually decreased, the gate oxide layer becomes thinner and thinner. Consequently, the breakage voltage of the gate oxide layer is reduced, and the breakage voltage at the PN junction of the semiconductor device is also reduced.

As known, during the manufacturing process of the integrated circuit, an ESD zapping effect may lead to damage of the integrated circuit. For avoiding the ESD zapping effect, the integrated circuit is usually equipped with an ESD circuit. The ESD circuit provides an ESD current path. Since the ESD current flows through the ESD current path, the internal circuit of the integrated circuit is not damaged by the ESD current.

SUMMARY OF THE INVENTION

An embodiment of the present invention provides an ESD circuit. The ESD circuit is connected between a power pad and a first node. The ESD circuit includes a RC circuit and a first ESD current path. The RC circuit is connected between the power pad and the first node. The RC circuit is capable of providing a first control voltage and a second control voltage. The first ESD current path is connected between the power pad and the first node. When the power pad receives a positive ESD zap, the first ESD current path is turned on in response to the first control voltage and the second control voltages provided by the RC circuit, so that an ESD current flows from the power pad to the first node through the first ESD current path.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

During a program cycle of a nonvolatile memory, a program voltage is provided to the nonvolatile memory to program the cells of the nonvolatile memory. Similarly, during an erase cycle of a nonvolatile memory, an erase voltage is provided to the nonvolatile memory to erase the cells of the nonvolatile memory.

Generally, the program voltage or the erase voltage is very close to the withstanding voltage of the semiconductor device but is not high enough to destroy the semiconductor device. For example, a semiconductor device of the nonvolatile memory is a MOS transistor. The operating voltage of the MOS transistor is 1.8V, and the program voltage of the MOS transistor is 4.5V. The MOS transistor can withstand the voltage stress of 4.5V. If the voltage stress is increased to 4.8V or higher, the MOS transistor is possibly damaged.

For overcoming the above drawbacks, it is necessary to install an ESD circuit in the nonvolatile memory. The turn-on threshold voltage of the ESD circuit is slightly higher than 4.5V and close to 4.5V. When the ESD zapping effect occurs in the nonvolatile memory, the ESD current can be dissipated away through the ESD circuit. Consequently, the internal circuit of the nonvolatile circuit can be protected.

Figure 1:
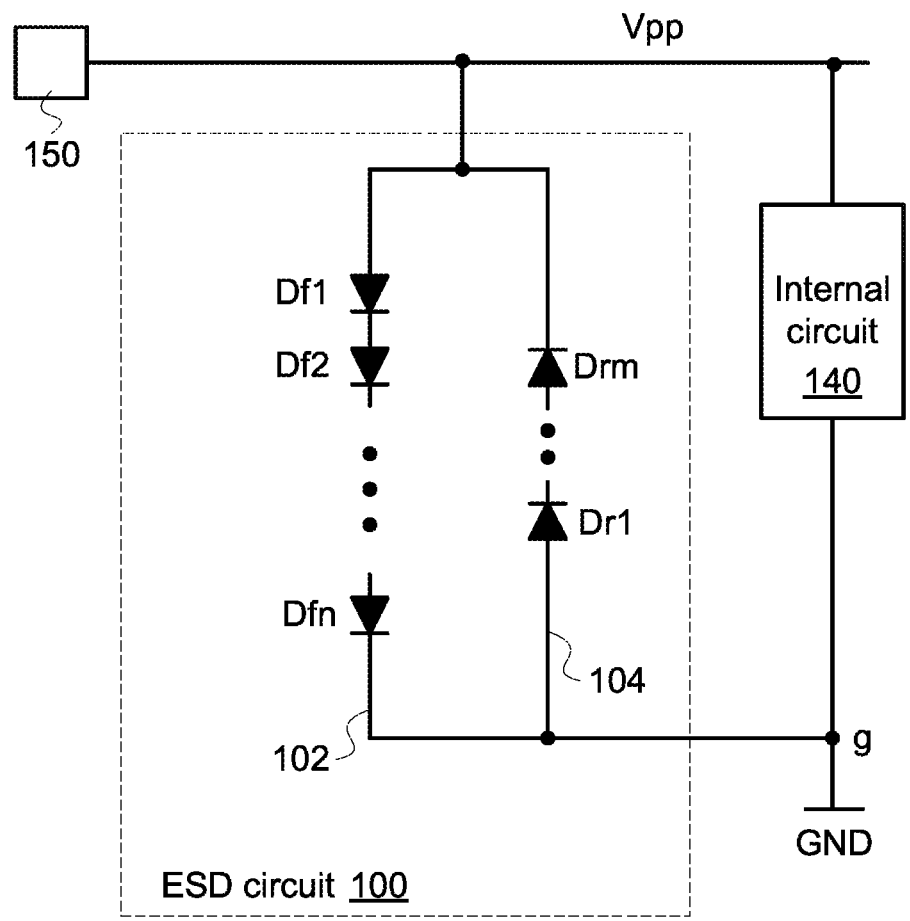
FIG. 1 is a schematic circuit diagram illustrating an ESD circuit according to a first embodiment of the present invention.

FIG. 1 is a schematic circuit diagram illustrating an ESD circuit according to a first embodiment of the present invention. The ESD circuit 100 and an internal circuit 140 are connected between a power pad 150 of a first supply voltage Vpp and a node g of a second supply voltage GND. The first supply voltage Vpp is transmitted from the power pad 150 to the ESD circuit 100 and the internal circuit 140. The second supply voltage GND is transmitted to the ESD circuit 100 and the internal circuit 140 through the node g. In an embodiment, the second supply voltage GND is 0V.

The ESD circuit 100 comprises a first ESD current path 102 and a second ESD current path 104. The first ESD current path 102 comprises n diodes Df1~Dfn. The n diodes Df1~Dfn are connected between the power pad 150 and the node g in series. The second ESD current path 104 comprises m diodes Dr1~Drm. The m diodes Dr1~Drm are connected between the power pad 150 and the node g in series.

The turn-on threshold voltage of the first ESD current path 102 can be expressed as n×Von, wherein Von is a cut-in voltage of the diode. For example, the cut-in voltage Von is 0.7V. If the voltage difference (Vpp–0V) between the first supply voltage Vpp and the second supply voltage GND is higher than n×Von, the first ESD current path 102 is turned on.

As mentioned above, the set value of the turn-on threshold voltage (n×Von) of the first ESD current path 102 must be higher than the first supply voltage Vpp (e.g., 4.5V). If the set value of the turn-on threshold voltage (n×Von) is lower than the first supply voltage Vpp (e.g., 4.5V), the first ESD current path 102 is mis-triggered. Similarly, the set value of the turn-on threshold voltage (n×Von) of the first ESD current path 102 must be lower than the total breakage voltage (m×Vbj) of the second ESD current path 104, wherein Vbj is a breakdown voltage of each diode. If the set value of the turn-on threshold voltage (n×Von) of the first ESD current path 102 is higher than the total breakage voltage (m×Vbj) of the second ESD current path 104, the second ESD current path 104 is mis-triggered and the diode breakdown will happen. If a positive ESD zap is received by the power pad 150, the first ESD current path 102 is turned on immediately. Consequently, the diodes of the second ESD current path 104 will not be suffered from breakage.

Similarly, the turn-on threshold voltage of the second ESD current path 104 can be expressed as m×Von. If the voltage difference (0V–Vpp) between the second supply voltage GND and the first supply voltage Vpp is higher than m×Von, the second ESD current path 104 is turned on.

For example, the cut-in voltage Von of the diode is 0.7V, the breakdown voltage Vbj of the diode is 4V, and the operating voltage of the internal circuit 140 is in the range between 0V and 4.5V. That is, the first ESD current path 102 needs to comprise at least 7 serially-connected diodes (7×0.7V=4.9V), and the second ESD current path 104 needs to comprise at least 2 serially-connected diodes (2×4V=8V). Consequently, the first ESD current path 102 or the second ESD current path 104 is not mis-triggered.

Due to the process variation, the cut-in voltage Von of the diode is possibly subjected to a change. For avoiding the change of the cut-in voltage Von of the diode, an additional diode is added to the first ESD current path 102. Consequently, in the normal working state of the ESD circuit 100, the first ESD current path 102 is not mis-triggered.

If a positive ESD zap is received by the power pad 150, the first ESD current path 102 is turned on. Meanwhile, the ESD current flows from the power pad 150 to the node g through the first ESD current path 102. Whereas, if a negative ESD zap is received by the power pad 150, the second ESD current path 104 is turned on. Meanwhile, the ESD current flows from the node g to the power pad 150 through the second ESD current path 104.

Figure 2A:
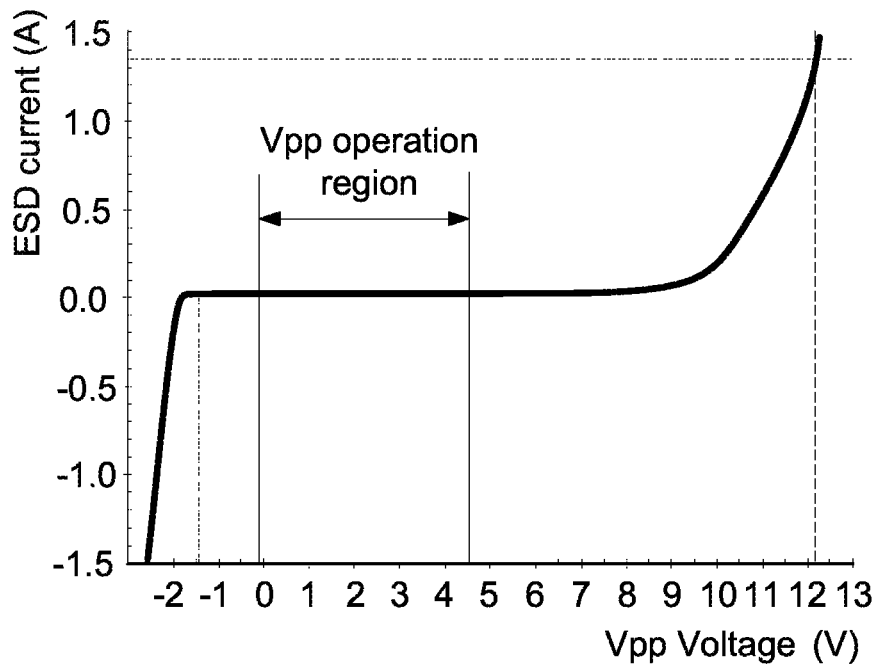
FIG. 2A is a plot illustrating the relationship between the voltage and the current of the ESD circuit according to the first embodiment of the present invention.

FIG. 2A is a plot illustrating the relationship between the voltage and the current of the ESD circuit according to the first embodiment of the present invention. In this embodiment, the first ESD current path 102 comprises 7 serially-connected diodes (i.e., n=7), and the second ESD current path 104 comprises 2 serially-connected diodes (i.e., m=2). Moreover, the operation region of the first supply voltage Vpp is 0V~4.5V. If the first supply voltage Vpp received by the internal circuit 140 is in the range between 0V and 4.5V, the ESD circuit 100 is disabled and two ESD current paths 102 and 104 are turned off.

If the first supply voltage Vpp is higher than 4.5V or the first supply voltage Vpp is lower than 0V, the ESD zapping effect possibly occurs. Consequently, the ESD circuit 100 is operated according to the change of the first supply voltage Vpp. When the first supply voltage Vpp is increased to 4.9, the ESD current reaches 1 μA. Meanwhile, it is considered that the first ESD current path 102 is turned on. When the first supply voltage Vpp is decreased to −1.4V, the ESD current reaches −1 μA. Meanwhile, it is considered that the second ESD current path 104 is turned on.

Figure 2B:
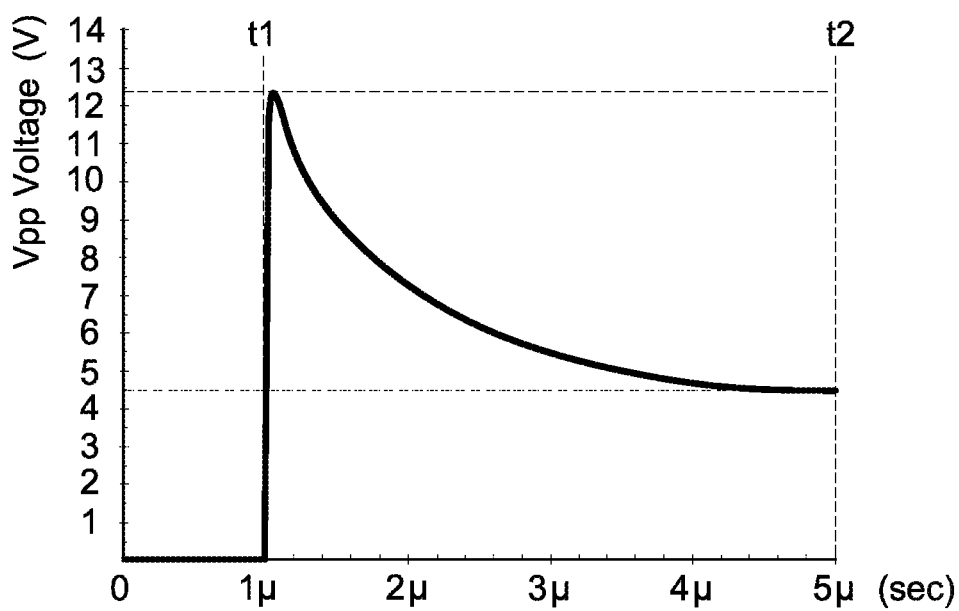
FIG. 2B is a plot illustrating the relationship between the voltage and the time of the ESD circuit according to the first embodiment of the present invention when the HBM test is performed.

FIG. 2B is a plot illustrating the relationship between the voltage and the time of the ESD circuit according to the first embodiment of the present invention when the HBM test is performed. Take a human body mode (HBM) test for example. When an electrostatic voltage of 2 KV is applied to the power pad 150, the first supply voltage Vpp is increased to 12V and the ESD current is increased to 1.33 A. Consequently, the first ESD current path 102 is turned on, and the ESD current is transferred to the node g through the first ESD current path 102.

Please refer to FIG. 2B again. At the time point t1, the electrostatic voltage of 2 KV is received by the power pad 150. The first supply voltage Vpp is increased to 12V in a very short time. Consequently, the first ESD current path 102 is turned on. Moreover, as shown in FIG. 2A, the ESD current is 1.33 A at the time point t1.

Since the first ESD current path 102 is turned on, the first supply voltage Vpp is decreased to below 4.9V at the time point t2. That is, the first supply voltage Vpp is decreased to below 4.9V within 4 μs by the ESD circuit 100. Consequently, the semiconductor device in the internal circuit is protected from damage.

Moreover, the ESD current possibly flows through the first ESD current path 102 or the second ESD current path 104. For preventing the ESD current to burn out the diodes Df1~Dfn and Dr1~Drm, the sizes of the diodes Df1~Dfn and Dr1~Drm should be large enough. However, due to the large sizes of the diodes Df1~Dfn and Dr1~Drm, the parasitic resistance is reduced. Consequently, the standby leakage current is increased. Generally, as the numbers n and m of the serially-connected diodes in the first ESD current path 102 and the second ESD current path 104 are increased, the magnitude of the standby leakage current is decreased. However, the increases of the numbers n and m influence the turn-on threshold voltages of the first ESD current path 102 and the second ESD current path 104. Meanwhile, it is necessary to judge whether the turn-on threshold voltage (n×Von) and the total breakage voltage (m×Vbj) are feasible.

As shown in FIG. 2B, the first supply voltage Vpp is decreased to a voltage level lower than 4.5V after the ESD zapping effect is eliminated. However, since the first supply voltage Vpp is maintained at a level near 4.5V for a certain time period, the semiconductor device in the internal circuit 140 is still influenced by the voltage stress of 4.5V. Consequently, the characteristics of the semiconductor device are deteriorated, and the use life of the semiconductor device is reduced.

Figure 3:
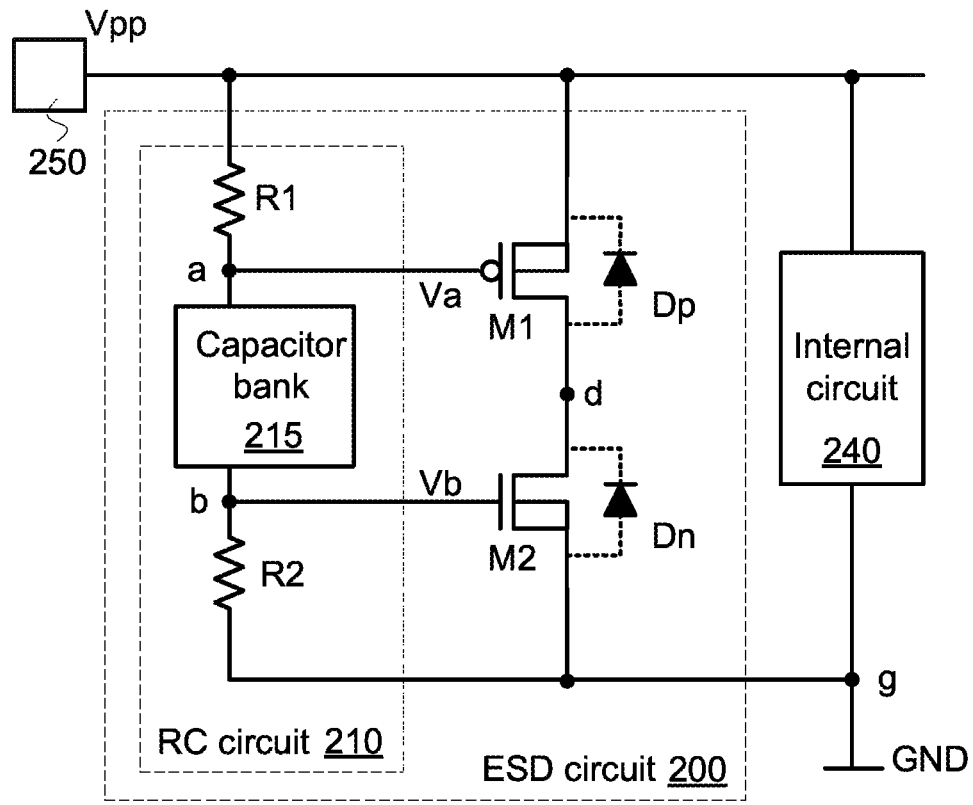
FIG. 3 is a schematic circuit diagram illustrating an ESD circuit according to a second embodiment of the present invention.

FIG. 3 is a schematic circuit diagram illustrating an ESD circuit according to a second embodiment of the present invention. The ESD circuit 200 and an internal circuit 240 are connected between a power pad 250 of a first supply voltage Vpp and a node g of a second supply voltage GND. The first supply voltage Vpp is transmitted from the power pad 250 to the ESD circuit 200 and the internal circuit 240. The second supply voltage GND is transmitted to the ESD circuit 200 and the internal circuit 240 through the node g.

In this embodiment, the ESD circuit 200 comprises a RC circuit 210, a P-type transistor M1 and a N-type transistor M2. Moreover, the P-type transistor M1 maybe a P-type FinFET (Fin Field-effect transistor), and the N-type transistor M2 maybe a N-type FinFET. The P-type transistor M1 is connected between the power pad 250 and a node d. The N-type transistor M2 is connected between the node d and the node g. The RC circuit 210 is connected between the power pad 250 and the node g. The RC circuit 210 includes two control terminals respectively connected to a control terminal of the P-type transistor M1 and a control terminal of the N-type transistor M2. Furthermore, the RC circuit 210 is capable of generating control voltages Va and Vb to turn on the P-type transistor M1 and the N-type transistor M2 when the ESD zap is received by the power pad 250.

The RC circuit 210 comprises a first resistor R1, a second resistor R2 and a capacitor bank 215. The first resistor R1 is connected between the power pad 250 and a node a. The second resistor R2 is connected between a node b and the node g. The node a generates the first control voltage Va. The node b generates the second control voltage Vb. The capacitor bank 215 is connected between the node a and the node b. It is worth noting that the capacitor bank 215 is not connected to the node d.

The P-type transistor M1 includes a first drain/source terminal connected to the power pad 250, a second drain/source terminal connected to the node d, a gate terminal connected to the node a, and a body terminal connected to the power pad 250. Moreover, the P-type transistor M1 is constructed in an N-well region, so that the P-type transistor has a parasitic diode Dp. A cathode terminal of the parasitic diode Dp is connected to the first drain/source terminal of the P-type transistor M1. An anode terminal of the parasitic diode Dp is connected to the second drain/source terminal of the P-type transistor M1.

The N-type transistor M2 includes a first drain/source terminal connected to the node d, a second drain/source terminal connected to the node g, a gate terminal connected to the node b, and a body terminal connected to the node g. Moreover, the N-type transistor M2 is constructed in a P-well region, so that the N-type transistor M2 has a parasitic diode Dn. A cathode terminal of the parasitic diode Dn is connected to the first drain/source terminal of the N-type transistor M2. An anode terminal of the parasitic diode Dn is connected to the second drain/source terminal of the N-type transistor M2. That is, the two parasitic diodes Dp and Dn are serially connected between the power pad 250 and the node g.

In an embodiment, the first supply voltage Vpp is 4.5V, and the second supply voltage GND is 0V. The resistance values of the first resistor R1 and the second resistor R2 are equal.

In this embodiment, a first ESD current path is defined by the first drain/source terminal of the P-type transistor M1, a channel region of the P-type transistor M1, the second drain/source terminal of the P-type transistor M1, the first drain/source terminal of the N-type transistor M2, a channel region of the N-type transistor M2, and the second drain/source terminal of the N-type transistor M2. The on/off states of the first ESD current path is controlled by the RC circuit 210.

Moreover, a second ESD current path is defined by the second drain/source terminal of the N-type transistor M2, the parasitic diode Dn, the first drain/source terminal of the N-type transistor M2, the second drain/source terminal of the P-type transistor M1, the parasitic diode Dp, and the first drain/source terminal of the P-type transistor M1. For example, the turn-on threshold voltage of the second ESD current path is 1.4V (=2×0.7V). If the voltage difference (0V−Vpp) between the second supply voltage GND and the first supply voltage Vpp is higher than 1.4V, the second ESD current path is turned on. The operations of the ESD circuit 200 will be described as follows.

In case that the first supply voltage Vpp is 4.5V and the second supply voltage GND is 0V, the voltage difference across the capacitor bank 215 is 4.5V. That is, the first control voltage Va is 4.5V and the second control voltage Vb is 0V.

The gate terminal of the P-type transistor M1 receives the first control voltage Va (4.5V) from the node a so that the P-type transistor M1 is turned off. The gate terminal of the N-type transistor M2 receives the second control voltage Vb (0V) so that the N-type transistor M2 is turned off. Since the P-type transistors M1 and the N-type transistor M2 are turned off, the first ESD current path is turned off.

Since the first supply voltage Vpp is 4.5V and the second supply voltage GND is 0V, the serially-connected parasitic diodes Dp and Dn are turned off. Meanwhile, the second ESD current path is turned off.

As mentioned above, the ESD circuit 200 is disabled and both of the first ESD current path and the second ESD current path are turned off when the first supply voltage Vpp is 4.5V and the second supply voltage GND is 0V. Since the first supply voltage Vpp is provided to the internal circuit 240, the internal circuit 240 can be normally operated.

Figure 4A:
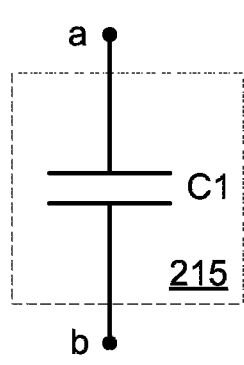
FIGS. 4A~4C illustrate examples of the capacitor banks.
Figure 4B:
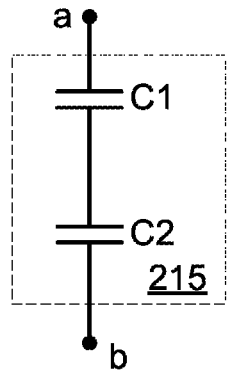
Figure 4C:
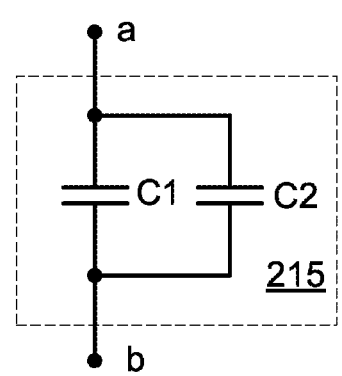

According to the second embodiment of the invention, the capacitor bank 215 includes at least one capacitor. FIGS. 4A-4C illustrate examples of the capacitor banks. As shown in FIG. 4A, the capacitor bank 215 includes only one capacitor C1 connected between the node a and the node b. As shown in FIG. 4B, the capacitor bank 215 includes two capacitors C1 and C2 connected between the node a and the node b in serial. As shown in FIG. 4C, the capacitor bank 215 includes two capacitors C1 and C2 connected between the node a and the node b in parallel. The operation of the capacitor bank 215 with two serially-connected capacitors will be described as follows. The operations of the other capacitor banks are not redundantly described herein.

Figure 5A:
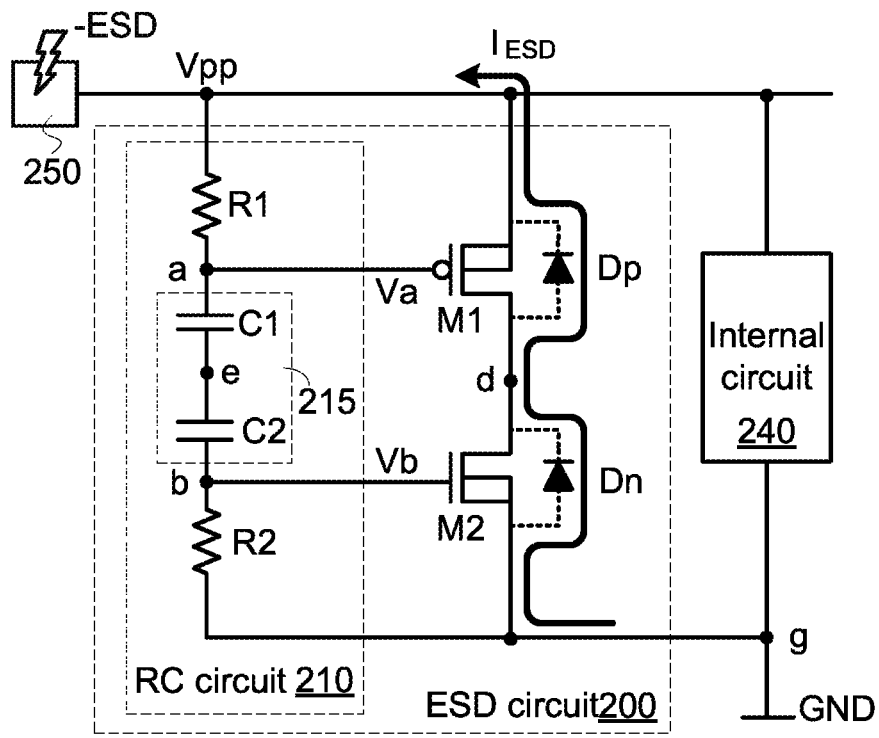
FIG. 5A is a schematic circuit diagram illustrating the ESD circuit of the second embodiment when a negative ESD zap is received.

FIG. 5A is a schematic circuit diagram illustrating the ESD circuit of the second embodiment when a negative ESD zap is received. When the negative ESD zap is received by the power pad 250, the second ESD current path is turned on. Consequently, the ESD current $I_{ESD}$ flows from the node g to the power pad 250 through the parasitic diodes Dp and Dn.

Figure 5B:
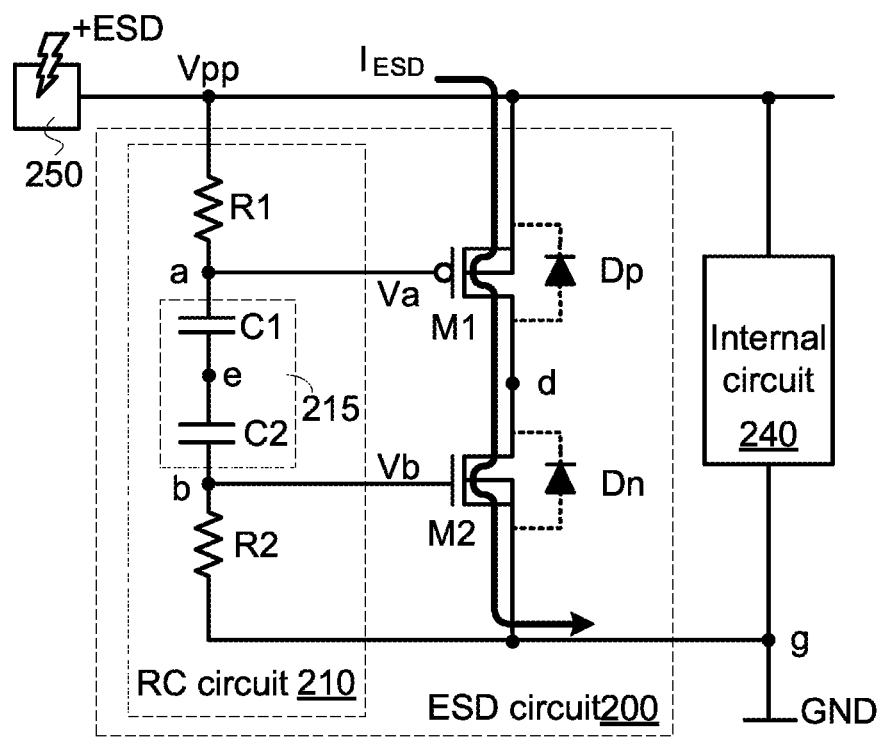
FIG. 5B is a schematic circuit diagram illustrating the ESD circuit of the second embodiment when a positive ESD zap is received.

FIG. 5B is a schematic circuit diagram illustrating the ESD circuit of the second embodiment when a positive ESD zap is received. When the positive ESD zap is received by the power pad 250, the first supply voltage Vpp is increased rapidly. Consequently, the capacitors C1 and C2 of the capacitor bank 215 are temporarily in the short-circuited state, the voltage on the node e is equal to Vpp/2, the first control voltage Va is slightly higher than Vpp/2 and second control voltage Vb is slightly lower than Vpp/2. For example, the first control voltage Va is (Vpp/2+ΔV) and the second control voltage Vb is (Vpp/2−ΔV). Since the gate terminals of the P-type transistor M1 and the N-type transistor respectively receive the first control voltage Va (i.e. Vpp/2+ΔV) and the second control voltage Vb (i.e. Vpp/2−ΔV), the P-type transistor M1 and the N-type transistor M2 are simultaneously turned on. Meanwhile, the first ESD current path is turned on. That is, when the positive ESD zap is received by the power pad 250, the first ESD current path is turned on. Under this circumstance, an ESD current $I_{ESD}$ flows from the power pad 250 to the node g through the P-type transistor M1 and the N-type transistor M2.

In an embodiment, the time constant of the RC circuit 210 is 1 μs. After the first ESD current path has been turned on for 1 μs, the first supply voltage Vpp is decreased to be below the turn-on threshold voltage, e.g. 4.5V. Consequently, the first control voltage Va is Vpp, the second control voltage Vb is 0V, i.e. the voltage difference across the capacitor bank 215 is equal to Vpp, and the P-type transistor M1 and the N-type transistor M2 are turned off. Meanwhile, the first ESD current path is turned off.

As mentioned above, the ESD current $I_{ESD}$ flows from the power pad 250 to the node g through the P-type transistor M1 and the N-type transistor M2 in a 1 μs cycle when a positive ESD zap is received by the ESD circuit 200.

Figure 6:
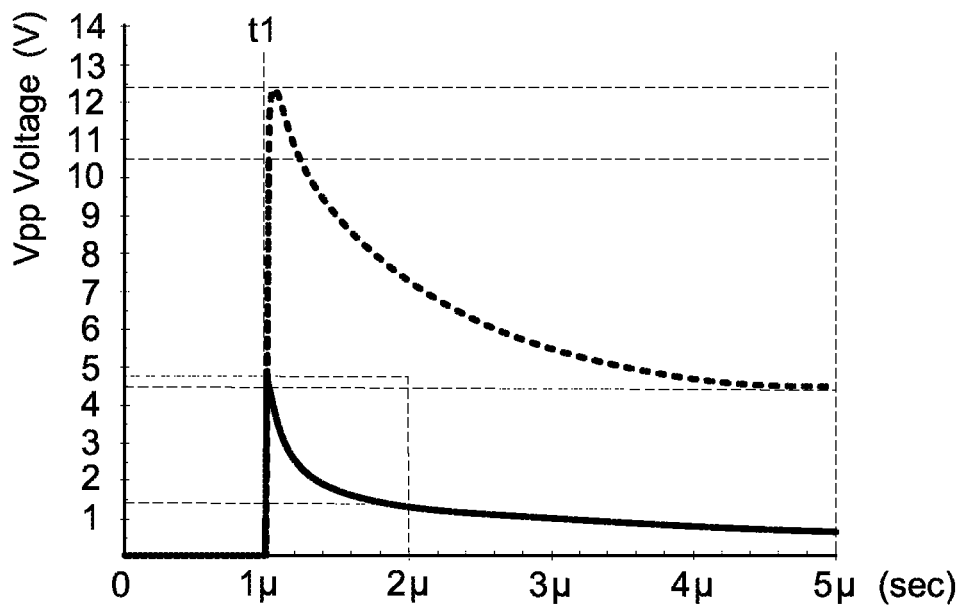
FIG. 6 is a plot illustrating the relationship between the voltage and the current of the ESD circuit according to the second embodiment of the present invention when the HBM test is performed.

FIG. 6 is a plot illustrating the relationship between the voltage and the time of the ESD circuit according to the second embodiment of the present invention when the HBM test is performed. Take a human body mode (HBM) test for example. When an electrostatic voltage of 2 KV is applied to the power pad 250, the first supply voltage Vpp is increased rapidly. Consequently, the first ESD current path is turned on, and the ESD current is transferred to the node g through the first ESD current path. The dotted curve indicates that the first supply voltage Vpp is increased to 12V by the ESD circuit 100 of the first embodiment. The solid curve indicates first supply voltage Vpp is only increased to 4.8V by the ESD circuit 200 of this embodiment. The difference between the two curves is about 7.2V.

Please refer to FIG. 6 again. At the time point t1, the electrostatic voltage of 2 KV is received by the power pad 250. The ESD current path is turned on in a very short time. Consequently, the peak voltage of the first supply voltage Vpp is only 4.8V and the ESD current is increased to 1.33 A.

Since the first ESD current path is turned on, the first supply voltage Vpp is decreased to the voltage level lower than 1.5V within 1 μs by the ESD circuit 200. After 5 μs, the first supply voltage Vpp is further decreased to a voltage level near 1V by the ESD circuit 200 of this embodiment after the ESD zapping effect is eliminated. Since the first supply voltage Vpp is continued decreasing to the voltage lower than 1V, the semiconductor device in the internal circuit 240 is not influenced. In other words, the discharge performance of the ESD circuit of this embodiment is enhanced.

According to semiconductor process, the first resistor R1 and the second resistor R2 maybe formed by polysilicon resistors, and the capacitor maybe formed by MIM (Metal-Insulator-Metal) capacitors. It is noted that implementation of the resistors and the capacitors of the RC circuit 210 is not limited to the embodiment mentioned above. Alternatively, in some other embodiments, the resistors and the capacitors maybe formed by transistors.

Figure 7:
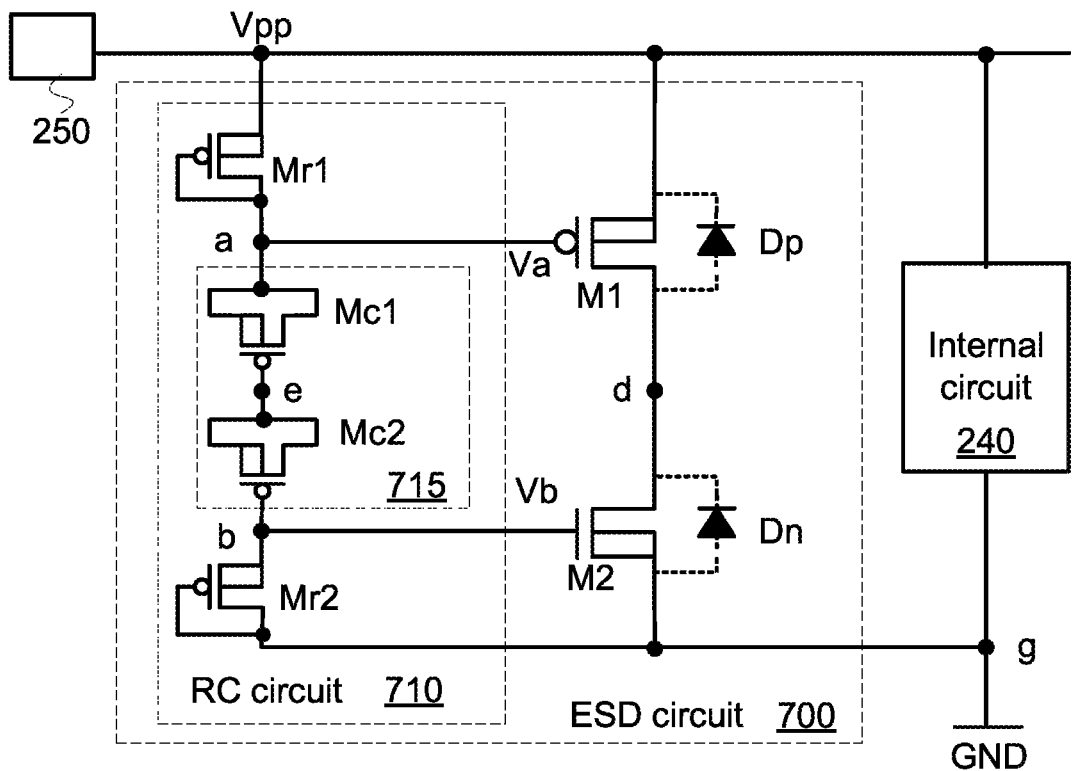
FIG. 7 is a schematic circuit diagram illustrating an ESD circuit according to a third embodiment of the present invention.

FIG. 7 is a schematic circuit diagram illustrating an ESD circuit according to a third embodiment of the present invention. In this embodiment, the ESD circuit 700 comprises a RC circuit 710, a P-type transistor M1 and a N-type transistor M2. The RC circuit 710 of the ESD circuit 700 is composed of transistors. Due to the connecting relationships between the transistors, some of the transistors have the resistive characteristics or the capacitive properties.

The RC circuit 710 comprises plural P-type transistors Mr1, Mr2, Mc1 and Mc2. Moreover, the P-type transistors Mr1, Mr2, Mc1 and Mc2 maybe P-type FinFETs. A first drain/source terminal and a body terminal of the P-type transistor Mr1 are connected to the power pad 250. A second drain/source terminal and a gate terminal of the P-type transistor Mr1 are connected to the node a. A first drain/source terminal and a body terminal of the P-type transistor Mr2 are connected to the node b. A second drain/source terminal and a gate terminal of the P-type transistor Mr2 are connected to the node g. Since the P-type transistors Mr1 and Mr2 are in diode connection, these transistors may be considered as resistors.

The capacitor bank 715 of the RC circuit 710 comprises the P-type transistors Mc1 and Mc2. A first drain/source terminal, a second drain/source terminal and a body terminal of the P-type transistor Mc1 are connected to the node a. A gate terminal of the P-type transistor Mc1 is connected to the node e. A first drain/source terminal, a second drain/source terminal and a body terminal of the P-type transistor Mc2 are connected to the node e. A gate terminal of the P-type transistor Mc2 is connected to the node b. Consequently, the P-type transistors Mc1 and Mc2 may be considered as capacitors connected in series.

The operating principles of the ESD circuit 700 of this embodiment are similar to those of the second embodiment, and are not redundantly described herein. It is noted that numerous modifications and alterations may be made while retaining the teachings of the invention. For example, in another embodiment, the ESD circuit comprises the RC circuit including two resistors formed by polysilicon resistors and two capacitors formed by transistors. In a further embodiment, the ESD circuit comprises the RC circuit including two resistors formed by transistors and two capacitors formed by MIM capacitors.

From the above descriptions, the present invention provides an ESD circuit for the nonvolatile memory. When the ESD zapping effect occurs in the nonvolatile memory, the ESD current can be dissipated away through the ESD circuit. Consequently, the internal circuit of the nonvolatile circuit can be protected.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electrostatic discharge (ESD) circuit connected to a power pad and a first node, the ESD circuit comprising:
   a RC circuit comprising: a first resistor, a second resistor, and a capacitor bank, wherein a first terminal of the first resistor is connected to the power pad, a second terminal of the first resistor is connected to a second node, a first terminal of the capacitor bank is connected to the second node, a second terminal of the capacitor bank is connected to a third node, a first terminal of the second resistor is connected to the third node, a second terminal of the second resistor is connected to the first node, the second node outputs a first control voltage, and the third node outputs a second control voltage; and
   a first ESD current path connected between the power pad and the first node, wherein when the power pad receives a positive ESD zap, the first ESD current path is turned on in response to the first control voltage and the second control voltages provided by the RC circuit, so that an ESD current flows from the power pad to the first node through the first ESD current path;
   wherein a first drain/source terminal and a body terminal of a first P-type transistor are connected to each other and served as the first terminal of the first resistor, and a second drain/source terminal and a gate terminal of the first P-type transistor are connected to each other and served as the second terminal of the first resistor; and wherein a first drain/source terminal and a body terminal of a second P-type transistor are connected to each other and served as the first terminal of the second resistor, and a second drain/source terminal and a gate terminal of the second P-type transistor are connected to each other and served as the second terminal of the second resistor.

2. The ESD circuit as claimed in claim 1, further comprising:

a third P-type transistor, wherein a first drain/source terminal and a body terminal of the third P-type transistor are connected to the power pad, a gate terminal of the third P-type transistor receives the first control voltage, and a second drain/source terminal of the third P-type transistor is connected to a fourth node; and a first N-type transistor, wherein a first drain/source terminal of the first N-type transistor is connected to the fourth node, a gate terminal of the first N-type transistor receives the second control voltage, and a second drain/source terminal and a body terminal of the first N-type transistor are connected to the first node.

3. The ESD circuit as claimed in claim 2, wherein the first ESD current path is defined by the first drain/source terminal of the third P-type transistor, a channel region of the third P-type transistor, the second drain/source terminal of the third P-type transistor, the first drain/source terminal of the first N-type transistor, a channel region of the first N-type transistor, the second drain/source terminal of the first N-type transistor.

4. The ESD circuit as claimed in claim 2, wherein the third P-type transistor comprises a first parasitic diode, an anode terminal of the first parasitic diode is connected to the second drain/source terminal of the third P-type transistor, and a cathode terminal of the first parasitic diode is connected to the first drain/source terminal of the third P-type transistor, and wherein the first N-type transistor comprises a second parasitic diode, an anode terminal of the second parasitic diode is connected to the second drain/source terminal of the first N-type transistor, and a cathode terminal of the second parasitic diode is connected to the first drain/source terminal of the first N-type transistor.

5. The ESD circuit as claimed in claim 4, wherein a second ESD current path is defined by the second drain/source terminal of the first N-type transistor, the second parasitic diode, the first drain/source terminal of the first N-type transistor, the second drain/source terminal of the third P-type transistor, the first parasitic diode and the first drain/source terminal of the third P-type transistor.

6. The ESD circuit as claimed in claim 1, wherein when the power pad receives a negative ESD zap, a second ESD current path is turned on, so that the ESD current flows from the first node to the power pad through the second ESD current path.

7. The ESD circuit as claimed in claim 1, wherein the capacitor bank includes at least one capacitor.

8. The ESD circuit as claimed in claim 7, wherein the at least one capacitor is a Metal-Insulator-Metal capacitor.

9. The ESD circuit as claimed in claim 1, wherein the capacitor bank comprises:

a first capacitor, wherein a first terminal of the first capacitor is connected to the second node, and a second terminal of the first capacitor is connected to a fifth node; and a second capacitor, wherein a first terminal of the second capacitor is connected to the fifth node, and a second terminal of the second capacitor is connected to the third node.

10. The ESD circuit as claimed in claim 9, wherein a first drain/source terminal, a second drain/source terminal and a body terminal of a fourth P-type transistor are connected to each other and served as the first terminal of the first capacitor, and a gate terminal of the fourth P-type transistor is served as the second terminal of the first capacitor, wherein a first drain/source terminal, a second drain/source terminal and a body terminal of a fifth P-type transistor are connected to each other and served as the first terminal of the second capacitor, and a gate terminal of the fifth P-type transistor is served as the second terminal of the second capacitor.

* * * * *